United States Patent
Everaert

(10) Patent No.: US 9,472,474 B2
(45) Date of Patent: Oct. 18, 2016

(54) METHODS FOR CHARACTERIZING SHALLOW SEMICONDUCTOR JUNCTIONS

(71) Applicant: IMEC vzw, Leuven (BE)

(72) Inventor: Jean-Luc Everaert, Gooik (BE)

(73) Assignee: IMEC VZW, Leuven (BE)

( * ) Notice: Subject to any disclaimer, the term of this patent is extended or adjusted under 35 U.S.C. 154(b) by 5 days.

(21) Appl. No.: 14/157,373

(22) Filed: Jan. 16, 2014

(65) Prior Publication Data

US 2014/0197862 A1   Jul. 17, 2014

(30) Foreign Application Priority Data

Jan. 17, 2013   (EP) .................................. 13151644

(51) Int. Cl.
*G01R 31/26* (2014.01)
*G01R 31/06* (2006.01)
*G01R 31/304* (2006.01)
(Continued)

(52) U.S. Cl.
CPC ........... *H01L 22/14* (2013.01); *G01R 31/2648* (2013.01); *H01L 2924/0002* (2013.01)

(58) Field of Classification Search
CPC ............ G01R 31/2831; G01R 31/311; G01R 31/2621; G01R 15/165; G01R 27/02; G01R 29/24; G01R 31/2648; H01L 22/14; H01L 27/0605; H01L 27/095
USPC ............... 324/178, 452, 455, 750, 754, 762; 257/259, 282, E21.531, E27.012, 257/E27.068
See application file for complete search history.

(56) References Cited

U.S. PATENT DOCUMENTS 4,638,341 A   1/1987   Baier et al.
4,812,756 A   3/1989   Curtis et al.
(Continued)

FOREIGN PATENT DOCUMENTS

EP   1998184 A1   12/2008

OTHER PUBLICATIONS

Baier et al., "FET Characterization Using Gated-TLM Structure," IEEE Transactions on Electron Devices, vol. ED-32, No. 12, Dec. 1985, pp. 2824-2829.
(Continued)

*Primary Examiner* — Tung X Nguyen
*Assistant Examiner* — Neel Shah
(74) *Attorney, Agent, or Firm* — Knobbe, Martens, Olson & Bear LLP

(57) ABSTRACT

The disclosed technology generally relates to methods of characterizing semiconductor materials, and more particularly to methods of characterizing shallow semiconductor junctions. In one aspect, the method of characterizing shallow semiconductor junctions comprises providing a substrate comprising a shallow junction formed at a first main surface, where the shallow junction is formed substantially parallel to the first main surface. The method additionally comprises providing a dielectric layer on the first main surface. The method additionally comprises iterating, at least twice, a combination of processes including providing a respective charge on a predetermined area of the dielectric layer via a charge applicator, and measuring a corresponding junction photovoltage for the predetermined area. The method further comprises deriving at least one of an average hole/electron mobility or a dose of active dopants in the substrate corresponding to the predetermined area, based on the respective charges and the corresponding junction photo voltages.

16 Claims, 6 Drawing Sheets

(51) Int. Cl.
  *G01R 31/311*  (2006.01)
  *H01L 21/66*   (2006.01)

(56) References Cited

U.S. PATENT DOCUMENTS

| | | | |
|---|---|---|---|
| 5,216,362 | A | 6/1993 | Verkuil |
| 5,519,334 | A * | 5/1996 | Dawson ............... G01R 31/02 324/765 |
| 5,834,941 | A | 11/1998 | Verkuil |
| 6,104,206 | A | 8/2000 | Verkuil |
| 6,255,128 | B1 * | 7/2001 | Chacon et al. ......... B01R 31/26 438/17 |
| 6,368,907 | B1 * | 4/2002 | Doi ..................... H01L 21/8238 438/217 |
| 7,019,513 | B1 * | 3/2006 | Faifer et al. ............. 324/754.23 |
| 7,521,946 | B1 | 4/2009 | Janik |
| 7,663,393 | B2 * | 2/2010 | Everaert et al. ......... 324/754.09 |
| 2008/0006886 | A1 * | 1/2008 | Mehta et al. ......... H01L 21/425 257/401 |
| 2011/0301892 | A1 * | 12/2011 | Kamieniecki ................... 702/65 |

OTHER PUBLICATIONS

Current et al., "Dopant Activation and Leakage Current Aspects of SDE/Halo CMOS Junctions Measured with Non-contact Junction Photo-Voltage Methods," IEEE, 2007, pp. 43-46.

Extended European Search Report for Application No. 13151644.5 dated May 14, 2013.

Séverac et al., "Evidence of the carrier mobility degradation in highly B-doped ultra-shallow junctions by Hall effect measurements," Materials Science and Engineering B, 154-155 (2008), p. 225-228.

Wilson et al., "Novel noncontact approach to monitoring the field-effect passivation of emitters," Energy Procedia 8, 2011, pp. 71-77.

Saraswat, "Shallow Junctions," EE 311/Saraswat, p. 1-20, downloaded from http://web.stanford.edu/class/ee311/NOTES/ShallowJunctions.pdf on Mar. 4, 2016.

Higashi, "Equipment Supplier's Perspective on the Evolution of Si Technology Development," Front End Products Group, Applied Materials, May 2005, p. 1-28.

Definition of: PN junction, PC Magazine Encyclopedia, downloaded from http:www.pcmag.com/encyclopedia/term/49415/pn-junction on Mar. 4, 2016.

B. Van Zeghbroeck, "Principles of Semiconductor Devices—Chapter 6: MOS Capacitors; 6.2: Structure and Principle of Operation"; 4 pages; 2011. Downloaded on May 3, 2016 from: http://ecee.colorado.edu/~bart/book/book/chapter6/ch6_2.htm.

Wikipedia: Doping (semiconductor); 10 pages; 2016. Downloaded on May 3, 2016 from: https://en.wikipedia.org/wiki/Doping_(semiconductor).

* cited by examiner

| sample | Implanted Dose ($10^{14}$ cm$^{-2}$) | Spike Anneal Temperature (°C) | $D_p$ ($10^{12}$ cm$^{-2}$) | % Boron activated | $\mu$ (cm$^2$/Vs) |
|---|---|---|---|---|---|
| #1 | 5 | 950 | 85 | 17 | 22 |
| #2 | 5 | 1050 | 195 | 39 | 32 |
| #3 | 1 | 950 | 13 | 13 | 33 |
| #4 | 1 | 1050 | 33 | 33 | 44 |

Fig. 3

METHODS FOR CHARACTERIZING SHALLOW SEMICONDUCTOR JUNCTIONS

CROSS-REFERENCE TO RELATED APPLICATIONS

This application claims foreign priority to European patent application EP 13151644.5 filed on Jan. 17, 2013, the content of which is incorporated by reference herein in its entirety.

BACKGROUND OF THE INVENTION

1. Field of the Invention

The disclosed technology generally relates to methods of characterizing semiconductor materials, and more particularly to methods of characterizing shallow semiconductor junctions.

2. Description of the Related Technology

Shallow junctions are used to form various semiconductor devices, including transistors, diodes, isolation regions and active regions, to name a few. Parameters that can be measured to characterize the shallow junctions include concentration of active dopants and electron and hole mobilities, among other parameters. While such parameters can be measured after fabrication of the semiconductor devices, it can be advantageous to measure them in-line, i.e., during fabrication, of the semiconductor devices. Advantages of measuring the parameters in-line can include early detection of manufacturing discrepancies and obtaining information related to thermal evolution of the shallow junctions, among others. In addition, when measured in-line, it can be advantageous to measure the parameters without making physical contact to the devices to avoid contamination.

For the fabrication of shallow junctions for use in semiconductor devices such as for instance transistors, the activation anneal, which is typically applied after dopant implantation in a substrate, has often severe thermal budget limitations. As a consequence typically not all implanted dopants are activated.

For process development of shallow junctions or passivation layers it is important and/or advantageous to know electrical characteristics of the junction.

A straightforward method known in the art is the use of the so-called "four point probe" that measures the sheet resistance ($R_s$) of the upper junction layer, possibly in combination with secondary ion mass spectroscopy (SIMS), which then allows to determine the active concentration and dose. However the use of the "four point probe" method and SIMS relies on theoretical mobility values of the free carriers in the upper layer of interest. As the sheet resistance depends on the active dose and the average mobility of the free charge carriers in the layer of interest, the upper layer, measuring this mobility is important. This can be done by Hall measurements, but these are not straight forward and require special attention when contacting the sample. It is not an in-line metrology method and no mapping capabilities are possible.

Techniques for efficient in-line metrology that can directly measure the active dose and average mobility of the free charge carriers in a shallow junction are be limited.

Thus, there is a need for an in-line metrology method for measuring parameters associated with shallow semiconductor junctions.

SUMMARY OF CERTAIN INVENTIVE ASPECTS

It is an aim of the present disclosure to provide a method for characterization of shallow junctions for use in semiconductor devices in-line (i.e. during process flow). Characterisation may for instance be based on performing local measurements, and may include representing the measurements in a map format.

A further aim of the present disclosure is to provide a method able to measure active dose and the average mobility of the free charge carriers directly and automatically.

A further aim is to provide a method which can be used for selecting manufacturing processes and for manufacturing process optimization of shallow junctions, as well as for quality control in manufacturing.

A further aim of the present disclosure is to avoid the high cost of characterisation by means of SIMS measurements as used in the prior art.

These aims are achieved according to the disclosure with a method showing the technical characteristics of the first independent claim.

It is another aim of the present disclosure to provide an associated computer program.

According to a first aspect of the present disclosure, a method is disclosed for characterization of shallow junctions for use in semiconductor devices, the method comprising:

a) providing a substrate comprising a shallow junction at a first main surface of the substrate, the shallow junction being formed substantially parallel to the first main surface;

b) providing a dielectric layer on top of the first main surface;

c) iterating a combination of the following iterated processes for at least two times:

providing and determining a value of a respective charge on a predetermined area of the dielectric layer by means of a discharge means;

measuring a corresponding junction photo voltage for the predetermined area;

d) deriving at least one of a measure of an average hole/electron mobility (for instance the average hole/electron mobility) or a measure of a dose of active dopants (for instance the dose of active dopants) for the predetermined area of the substrate, from the respective charges and the corresponding junction photo voltages.

This provides the advantage that in-line metrology can be performed, whereby active dose and the average mobility of the free charge carriers is determined directly and automatically. The dopant activation process in the shallow junction can thereby closely be monitored and analyzed.

The substrate can be for instance a silicon, germanium or GaAs substrate. It can be any state of the art semiconductor substrate known to the skilled person on which a shallow junction is applied on a main surface.

The predetermined area may comprise the full first main surface of the substrate.

The shallow junction can be formed by ion implantation processes known to the skilled person. The junction can preferably have a thickness (or depth in another view) smaller than 100 nm, more preferably smaller than 75 nm, more preferably smaller than any value of 50, 40, 30, 20, 10 nm.

Providing and determining a value of a respective positive or negative charge on a predetermined area of the dielectric layer may embody a series of stepwise processes in which charges are added/removed for each iteration. The amount of removed or added charges between two iterations can for instance be substantially constant.

The dielectric layer may be any state of the art dielectric layer known to be suitable to the skilled person. It may for instance be a $SiO_2$ layer, which can for instance be deposited by a Plasma Enhanced CVD process (CVD). The thickness of the dielectric layer can be within the range of 10 to 100 nm.

According to embodiments, the method further comprises removing or neutralizing the deposited charges from the predetermined area of the dielectric layer, after the series of iterations has ended (i.e. after iterating a combination of the iterated processes). Removing or neutralizing charges from the predetermined area of the dielectric layer can also be performed before starting the series of iterations (i.e. before iterating a combination of the iterated processes), if necessary.

This provides the advantage that the method may be repeated under the same initial conditions.

According to certain embodiments, possibly an initial corona charge deposition can be provided to compensate initial existing charge in the dielectric or charge contained in or at the interface traps. When the process is to be repeated under the same initial conditions, e.g. in order to estimate or reduce the systematic error of the method, the initial corona charge deposition can be repeated also.

According to embodiments, deriving at least one of a measure of an average hole/electron mobility or a measure of a dose of active dopants for the predetermined area comprises performing a linear fit.

According to embodiments, the linear fit is based on the relation $1/R_s = \mu_p \cdot (q \cdot D_p - Q_c)$ for $p^+$/n-Si and $1/R_s = \mu_n \cdot (q \cdot D_n + Q_c)$ for $n^+$/p-Si junctions, wherein $Q_c$ is the respective charge deposited on the dielectric layer, $R_s$ is the sheet resistance of the upper junction layer, $D_p/D_n$ is the authentic dose of holes/electrons before providing any charges, $\mu_p$ and $\mu_n$ are the average hole/electron mobility in the respective $p^+/n^+$ layer of the shallow junction, and q is the unit of electrical charge.

According to embodiments, the dielectric layer and the first main surface are in direct contact. The dielectric layer can be deposited on the first main surface.

According to embodiments, the respective charges are provided by corona charging.

According to embodiments, the shallow junction is a junction of the $p^+$n type.

According to embodiments, the shallow junction is a junction of the $n^+$p type.

According to embodiments, the respective charges are positive. They can for instance comprise positively charged ions.

According to embodiments, the respective charges are negative. They can for instance comprise negatively charged ion.

In second aspect of the present disclosure, a method is disclosed for mapping characteristic information for a shallow junction on a substrate, comprising performing a method according to any of the embodiments of the first aspect, on at least two predetermined and disjoint areas.

According to embodiments, the method for mapping is being performed on a plurality of predetermined disjoint areas, and the union of the predetermined disjoint areas corresponds to the first main surface of the substrate.

According to a third aspect of the present disclosure, a computer program is disclosed adapted for performing the processes of deriving at least one of a measure of an average hole/electron mobility or a measure of a dose of active dopants for a predetermined area of a substrate comprising a shallow junction, from respective charges and corresponding junction photo voltages as described in step (c) of the method according to the first aspect, when being run on a computer. The computer program may further be adapted to perform further processes of the method as explained for the first aspect. For instance, it may be adapted for performing a linear fit for deriving at least one of a measure of an average hole/electron mobility or a measure of a dose of active dopants for the predetermined area. Such a linear fit may be based on the relation $1/R_s = \mu_p \cdot (q \cdot D_p - Q_c)$ or $1/R_s = \mu_n \cdot (q \cdot D_n + Q_c)$, as explained for the first aspect.

BRIEF DESCRIPTION OF THE DRAWINGS

The disclosure will be further elucidated by means of the following description and the appended figures.

FIG. 3 is a table providing an overview of results that can be obtained from the data shown in FIG. 2.

DETAILED DESCRIPTION OF CERTAIN ILLUSTRATIVE EMBODIMENTS

Figure 1:
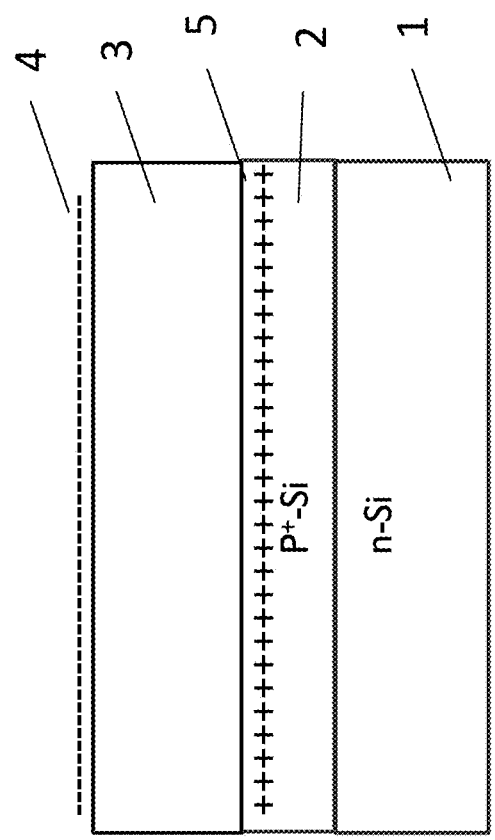
FIG. 1 shows a structure that can be used for performing a method of characterizing shallow junctions according to various embodiments.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

In order to illustrate aspects of the present disclosure, a metrology tool of the Semilab WT-2000 type has been used, which comprises capabilities of corona charging and Junction Photo Voltage measurement (JPV). The functioning of this device is considered to known to the skilled person, and some relative aspects of its functioning has been described for instance in European Patent EP1998184 B1, which is hereby incorporated by reference in its entirety.

The method comprises the combination of at least two measurement modules or devices, more specifically the combination of a first module able to apply a corona charge on a specific area on the interface surface and measuring the related surface voltage (referred to as Q-V module) and of a second module (referred to as the junction photovoltage module or JPV module), applying a laser or LED pulse at a fixed frequency leading to an illuminated spot within the specific area and subsequently measuring the induced photovoltage (V1) inside and (V2) outside respectively the illumination spot by means of two electrodes.

The two electrodes measuring the voltages are preferably concentric or at least partly concentric. Alternatively the electrodes can be linear (in case the laser or LED spot is a concentric spot). The mobility is then derived from the sheet resistance (sheet resistance is inversely proportional to the mobility), that itself derives from the induced photovoltage (V1) and (V2) measured respectively inside and outside the illumination spot.

As used herein, an illuminated spot refers to a small area receiving a certain amount of energy from a light source such as a laser or an LED.

As used herein, a corona charge refers to ionized molecules created by a corona discharge effect, such as ionized molecules that may be created upon application of high voltage between a sharply curved electrode and the ground, where the high voltage exceeds the Corona Inception Voltage of the charger assembly.

In some embodiments, the method starts with a process of applying a corona charge on a dielectric layer to attract or repulse free charge carriers in a $p^+$ or an $n^+$ top layer of a PN junction. The corresponding surface potential can then be measured without making physical contacts to the $p^+$ or $n^+$ layers using a Kelvin probe through the Q-V module, to determine whether any corona charge leaked away. Subsequently, a measurement is made with the JPV module, whose results can be used to determine the sheet resistance of the $p^+$ or $n^+$ layer of the shallow junction.

In some embodiments, the process of applying a corona charge can be performed over the entire substrate (e.g., wafer) by using a corona charge applicator. The corona charge applicator can include, for example, a metallic (e.g., tungsten) wire at a fixed potential (e.g., 10 kV) that is passed over the substrate surface. Alternatively, the corona charge applicator can include a corona jet configured to deposit the Q-V corona charge locally. In the corona jet, airflow blows out ions generated in an assembly comprising a sharp needle centered in a tube configured to blow a corona charge on the substrate surface locally on a predetermined area (e.g., approximately 1 cm$^2$ in area). The related surface voltage Vs (at least on the specific area) can be measured contactless using a Kelvin probe.

As used herein, a Kelvin probe refers to a vibrating electrode (e.g., approximately 0.5 cm$^2$ area) positioned over the surface forming a capacitor. In operation, without being bound to any theory, when the voltage applied to the electrode of the Kelvin probe is equal to the surface voltage, the magnitude of an AC current flow between the electrode and the surface reaches a minimum, thereby providing a method to measure the surface voltage without making physical contact. One example such Kelvin probe is manufactured by Trek, Inc.

In some embodiments, the process of measuring the sheet resistance of the free charge carriers in the $p^+$ or $n^+$ layer under the dielectric layer is performed using the JPV module. The JPV module can be used with a laser or LED pulse that creates electron-hole pairs in the underlying (e.g. Si or Ge) substrate. By applying a laser or LED pulse at a fixed frequency, an illuminated spot is created under the inner electrode, while the outer electrode remains in the dark region. Using an appropriate wavelength for the LED or laser light (e.g., 470 nm in case for Si), electron hole pairs are created in the illuminated region. On a $p^+$n-type shallow junction, the internal electric field of the junction can move an excess amount of holes into the $p^+$ layer near the interface between the dielectric layer and the substrate, which can be, for example, a Si substrate. Due to the charge gradient, an electric field parallel to the interface spreads out the excess charges radially and parallel to the interface.

In some embodiments, by using two at least partly concentric electrodes whereby one electrode (R1) is situated within the illuminated spot and one electrode (R2) is situated outside the illuminated spot, the induced photovoltage V1 (originating from R1) and V2 (originating from R2) can be derived. In some implementations, the at least partly concentric electrodes can have a ring structure. The voltages V1 and V2 respectively are measured preferably contactless by the electrodes R1 and R2 respectively.

Alternatively, in other implementations, the electrodes can have other arrangements, for instance a linear arrangement of electrodes, e.g., finger-shaped electrodes.

The measurement of the voltages V1 and V2 originating from the at least partly concentric electrodes can be performed in a contactless manner by capacitive coupling.

The method which combines JPV measurements with corona voltage deposition can be applied on different wafer sites such that a sheet resistance mapping system is created. This new mapping method makes it possible to characterize the shallow junction on a substrate (e.g. Si wafer).

According to various embodiments of the disclosure, the process of applying a corona charge can be applied over the entire surface of the substrate, for example, by passing a metallic (e.g. tungsten) wire over the wafer, where the wire is at a fixed voltage, e.g., at 10 kV.

It will be appreciated that the metallic wire can be passed over the substrate at a constant speed and/or using linear movements in X and Y coordinates, or at non constant speed and/or in other suitable coordinates. The speed of the displacement of the means creating the corona charge (a metallic wire or corona jet) can lead to the formation of the corona charges having a charge density.

Among other factors, the speed at which the metallic wire passes over the substrate can determine the charge deposition. In some embodiments, the speed can have a range between about 0.01 and about 20 cm/s.

Alternatively, the process of applying a corona is can be implemented locally on a dedicated area by using a corona jet, which blows corona charge on the wafer surface locally onto an area about 2 cm$^2$.

According to various embodiments of the disclosure, the process of measuring the surface voltage Vs at least locally on a dedicated area is performed using a Kelvin probe. In some embodiments, the measurement is performed contactless.

According to various embodiments of the disclosure, the process of creating an excess amount of free charges in the shallow junction (holes for p$^+$-type silicon, electrons for n$^+$-type silicon) at least locally on a dedicated area onto the substrate is performed using a laser or LED pulse which creates electron hole pairs in the substrate underneath the at least one dielectric layer such that an excess amount of the free charges is created locally in the upper layer of the shallow junction near the interface formed by the surface dielectric layer and semiconductor.

According to various embodiments of the disclosure, the process of measuring the photovoltage inside and outside the illuminated spot by means of two at least partly concentric electrodes is performed using the Junction Photo Voltage module. The basis of the JPV measurement is to use photo excitation of charge carriers and to monitor in a spatially resolved manner the JPV signals inside and outside the illumination spot.

According to various embodiments of the disclosure, the substrate can be a flat substrate such as, e.g., a silicon (Si) wafer or a germanium (Ge) wafer. The substrate can also be a SOI (Silicon-On-Insulator) or a GOI (Germanium-On-Insulator) substrate, which are silicon (for SOI) or germanium (for GOI) wafers with a thin layer of buried dielectric layer, such as an oxide (e.g., SiO$_2$). The substrate can be cleaned prior to the process of depositing a dielectric layer to remove contaminants. Preferably the substrate can be doped and annealed to obtain, e.g. a p$^+$n-doped or an n$^+$p-doped shallow junction substrate.

According to another embodiment of the disclosure, the at least one dielectric layer is a single dielectric layer or a combination of dielectric layers (for example a "dual dielectricum"). Examples of dielectric materials include SiO$_2$, SiN, SiON, HfO$_2$ or other metallic/rare-earth oxides, such as ZrO$_2$, Al$_2$O$_3$, La$_2$O$_3$, Pr$_2$O$_3$, and Ta$_2$O$_5$, and the related silicates of the rare-earth metals of the rare-earth oxides, among other dielectric materials. The dielectric layer can have a thickness, for instance, within the range of between about 10 nm and about 100 nm.

According to various embodiments of the disclosure, the process of depositing at least one dielectric layer is performed using a suitable deposition technique such as, for instance, Chemical Vapor Deposition (CVD), Plasma Enhanced CVD (PECVD), Metal Organic Chemical Vapor Deposition (MOCVD) and Atomic Layer Deposition (ALD), among other deposition techniques.

FIG. 1 illustrates a method according to an embodiment of the present disclosure. An n-type silicon substrate 1 is provided. After shallow junction formation by ion implantation of p-dopants to define, for example, a p$^+$n junction 2 at or near a front surface of the substrate, an electrical insulating dielectric 3 is deposited on the p$^+$n junction 2. By way of example, a CVD oxide with a thickness of 50 nm is formed, e.g., deposited, at 400° C. In addition, a shallow p$^+$n junction is used, made by B-implant in n-type silicon at 0.2 keV.

Still referring to FIG. 1, after forming the insulating dielectric 3, a series of depositions of corona charge 4 can be performed, each followed by a junction photovoltage (JPV) measurement. This type of measurement is further denoted as CJPV. The JPV delivers the sheet resistance R$_s$ of the p$^+$ layer below the dielectric layer 3, which is an oxide in the illustrated example in FIG. 1. The dielectric 3 substantially inhibits the corona charge from leaking away and influences the amount of free carriers in the p$^+$ layer by induction. For example, a positive corona charge can repulse the holes in the p$^+$ layer, thereby resulting in a higher R$_s$. On the other hand, a negative corona charge can attract an equal amount of positively charged holes 5, thereby decreasing the Rs. Without being bound to any theory, 1/Rs can be expressed as $$1/R_s = \mu \cdot (q \cdot D_p - Q_c), \quad [1]$$

where $\mu$ is the average hole mobility in the p$^+$ layer, D$_p$ is the original (before corona charging) dose of holes and q is the unit charge. D$_p$ is to good approximation equal to the dose of active boron dopants. Q$_C$ is the corona charge deposited on the oxide which can be positive as well as negative. A linear relationship exists between 1/R$_s$ and Q$_C$, and when plotted the slope of the 1/R$_s$ vs. Q$_C$ curve represents the average hole mobility while the x-axis intersection represents qD$_p$. Without being bound to any theory, if an amount of corona charge Qc equal to qD$_p$ could be deposited, then no conductance would be detected according to Equation [1] above. However, having no conductance detected can be impractical, as the amount of corona charge can be sufficiently high such that the corona charge can, for example, leak away by tunnelling through or by break down of the dielectric 3. Under these practical circumstances, an extrapolation from the data points can be made, as shown in FIG. 2.

It will be appreciated that, while FIG. 1 illustrates the method of characterizing a shallow p$^+$n junction, similar characterization technique can be applied on a shallow n$^+$p junction, for instance, comprising arsenic (As) or phosphorus (P), implanted in a p-type silicon substrate. It will be further be appreciated that junctions formed in other substrates can also be characterized, for instance Ge and GaAs substrates.

Figure 2:
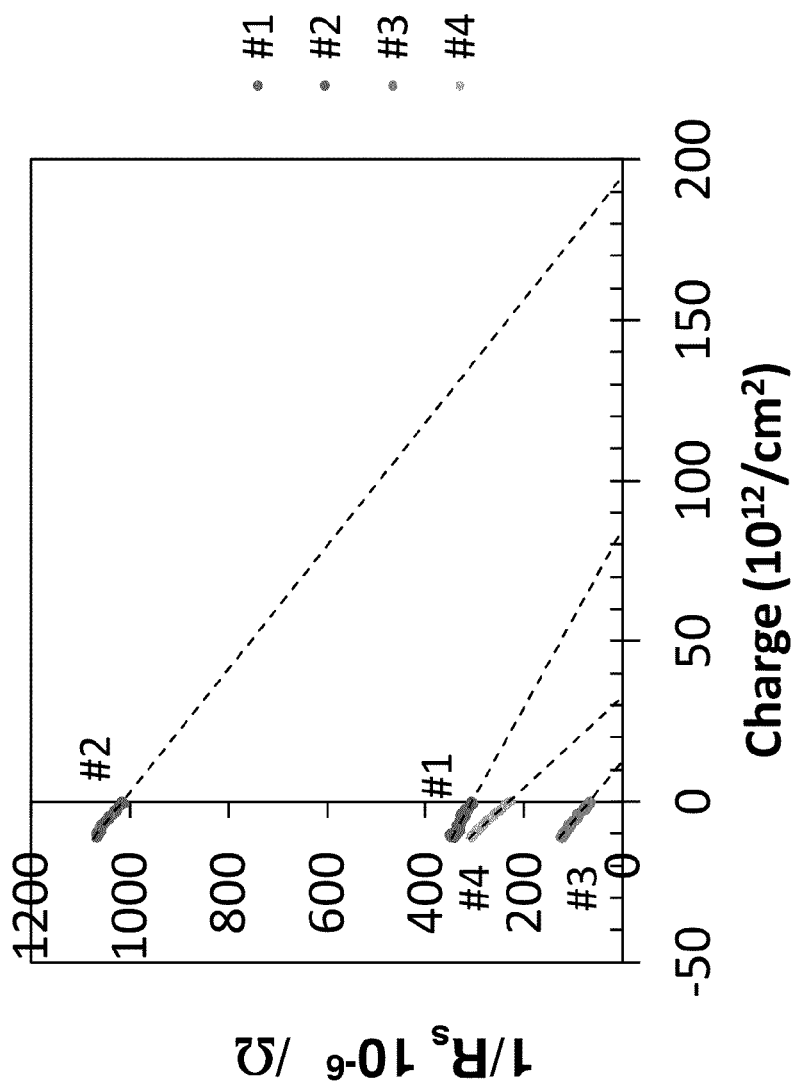
FIG. 2 illustrates an embodiment of the present disclosure based on a linear fitting of the measured data.

FIG. 2 is a graph illustrating results (#1, #2, #3, #4) of CJPV measurements made on example shallow p$^+$n junctions, according to an embodiment. As described above, the slopes extracted from lines fitted to the measurements plotted as 1/R$_s$ vs. Q$_C$ correspond or are related to hole mobilities of the measured shallow junctions. In addition, while the x-axis intersection of each fitted line corresponds or is related to the active dose in the shallow junction.

The table of FIG. 3 shows the results for #1, #2, #3, #4 obtained using the CJPV method, according to an embodiment. Parameters that can be extracted from the measured junctions include percentage of activated dopants and carrier mobilities. FIG. 3 illustrates, for example, higher percentage of activated dopants corresponding to higher anneal temperatures. In addition, FIG. 3 illustrates mobility values in agreement with literature (e.g. F. Severac et. al., Mater. Sci. Eng. B, 154-155 (2008), p. 225-228), obtained from junctions formed under similar process conditions.

It will be appreciated that this combination of corona charge and JPV can be implemented as a fully automated, fast, in-line metrology. The automatization also allows mapping capability.

Figure 4:
FIG. 4 illustrates a mobility map of a shallow junction measured with a method according to some embodiments.
Figure 5:
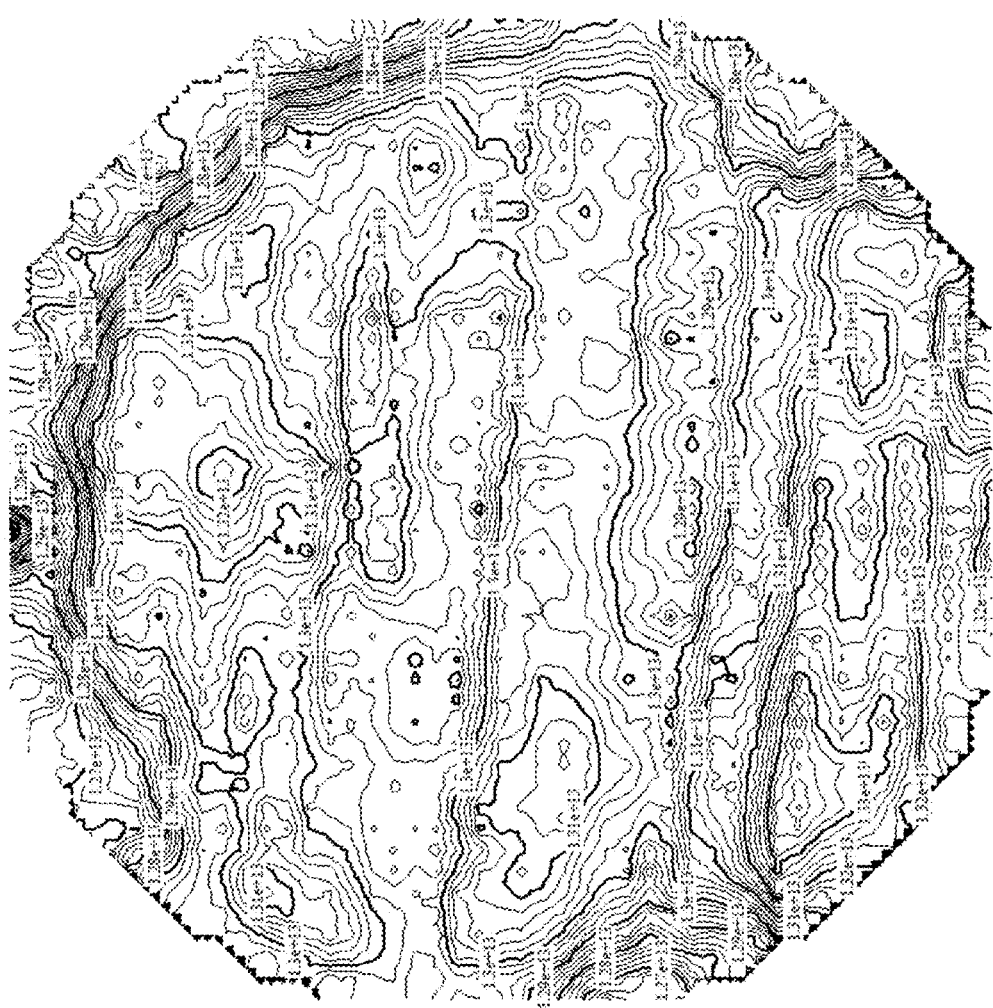
FIG. 5 illustrates an active dose map of a shallow junction measured with a method according to some embodiments.

FIG. 4 and FIG. 5 illustrate wafer maps derived with methods according to the present disclosure, based on a silicon substrate which was exposed to a 0.2 keV, B 1E14 cm$^{-2}$ doping level and a spike anneal at 950° C. to produce a shallow junction. The map resolution for this example was 4×4 mm$^2$. The above described calculation was applied to obtain $\mu$ and D$_p$ for each pixel of the map. A contour map was calculated therefrom. FIG. 4 depicts a mobility map (in cm$^2$/Vs). FIG. 5 depicts an active dose map (cm$^{-2}$).

Figure 6:
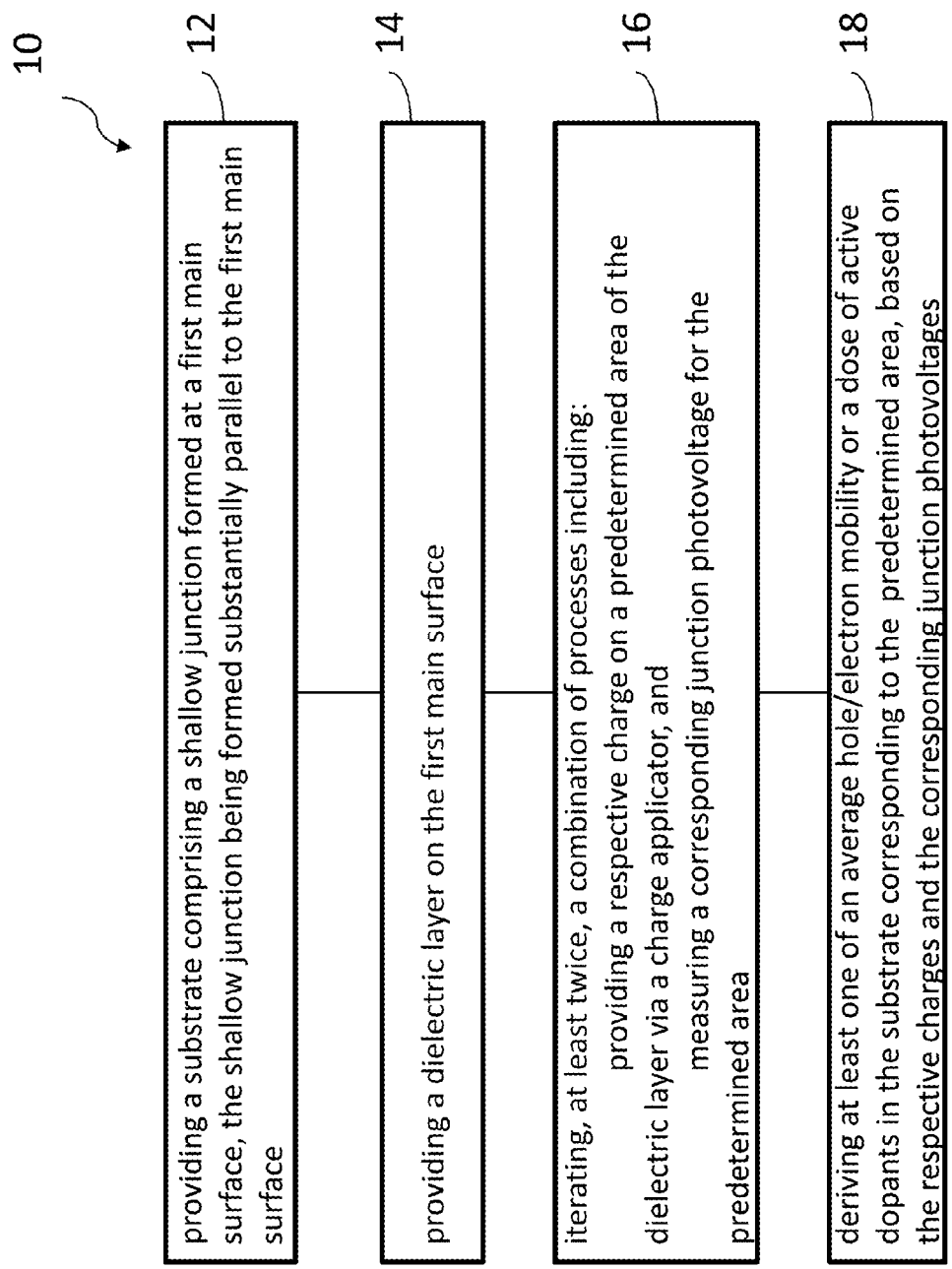
FIG. 6 is a flow chart illustrating a method of characterizing shallow semiconductor junctions according to some embodiments.

FIG. 6 is a flow chart illustrating a method 10 of characterizing shallow semiconductor junctions according to some embodiments. The method 10 comprises at a process 12 providing a substrate comprising a shallow junction formed at a first main surface, where the shallow junction is formed substantially parallel to the first main surface. The method 10 additionally comprises providing at a process 14 a dielectric layer on the first main surface. The method 10 additionally comprises at a process 16 iterating, at least twice, a combination of processes including providing a respective charge on a predetermined area of the dielectric layer via a charge applicator, and measuring a corresponding junction photovoltage for the predetermined area. The method 10 further comprises at a process 18 deriving at least one of an average hole/electron mobility or a dose of active dopants in the substrate corresponding to the predetermined area, based on the respective charges and the corresponding junction photo voltages.

In some embodiments, at least a portion of the method of FIG. 6 can be carried out using a computer algorithm adapted for performing the method. For example, after providing the substrate and the dielectric at the processes 12 and 14, deriving at the process 18 the at least an average hole/electron mobility or a dose of active dopants for a predetermined area of a substrate comprising a shallow junction, from respective charges and corresponding junction photo voltages as used and/or derived in iterating the combination of processes at the process 16 can be implemented in a computer system.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium may be coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well.

What is claimed is:

1. A method of characterizing shallow semiconductor PN junctions, the method comprising:
providing a substrate comprising a shallow PN junction formed at a first main surface, the shallow PN junction comprising a p-type region and an n-type region and being formed substantially parallel to the first main surface;
providing a dielectric layer contacting the first main surface thereby forming a dielectric/semiconductor interface with one of the p-type region or the n-type region, wherein the shallow PN junction has a depth less than 100 nm from the dielectric/semiconductor interface;
iterating, at least twice, a combination of processes including:
providing a respective charge on a predetermined area of the dielectric layer via a charge applicator, and
measuring a corresponding junction photovoltage for the predetermined area; and
deriving at least one of an average hole/electron mobility or a dose of active dopants in the substrate corresponding to the predetermined area, based on the respective charges and the corresponding junction photovoltages.

2. The method of claim 1, further comprising removing or neutralizing deposited charges from the predetermined area of the dielectric layer, before iterating the combination of processes.

3. The method of claim 1, wherein deriving the at least one of the average hole/electron mobility or the dose of active dopants for the predetermined area comprises performing a linear fit.

4. The method of claim 3, wherein performing the linear fit includes fitting using at least one of the relations expressed by $1/Rs=\mu p \cdot (q \cdot Dp-Qc)$ and $1/Rs=\mu n \cdot (q \cdot Dn+Qc)$, wherein Qc is the respective charge deposited on the dielectric layer, Rs is the sheet resistance of the upper junction layer, Dp and Dn are doses of holes and electrons, respectively, before providing the respective charges, $\mu p$ and $\mu n$ are average hole and electron mobilities, respectively, in an upper layer of the shallow PN junction comprising one of a $p^+$ layer or an $n^+$ layer, and q is the unit of electrical charge.

5. The method of claim 1, wherein the respective charges are provided by corona charging.

6. The method of claim 1, wherein the shallow PN junction is a $p^+n$ type junction.

7. The method of claim 1, wherein the shallow PN junction is an $n^+p$ type junction.

8. The method of claim 1, wherein the respective charges are positive.

9. The method of claim 1, wherein the respective charges are negative.

10. The method of claim 1, wherein the method further comprises mapping characteristic information for the shallow PN junction on a substrate, wherein mapping includes iterating the combination of processes on and deriving the at least one of the average hole/electron mobility or a dose of active dopants from a plurality of predetermined and disjoint areas of the substrate.

11. The method of claim 10, wherein a union of the predetermined and disjoint areas corresponds to the first main surface of the substrate.

12. The method of claim 1, wherein providing the respective charge includes passing a charge applicator comprising a metallic wire at a fixed potential over the substrate.

13. The method of claim 1, wherein providing the respective charge includes blowing a corona charge using a corona jet, wherein the corona jet comprises a needle centered in a tube configured to blow the corona charge locally on the substrate.

14. The method of claim 1, further comprising, after providing the respective charge, measuring using a Kelvin probe to determine whether the amount of respective charge has changed, and thereafter measuring the corresponding junction photovoltage.

15. The method of claim 1, wherein the shallow PN junction has a depth less than 50 nm from the dielectric/semiconductor interface.

16. A system for characterizing shallow PN junctions, the system comprising:
- a semiconductor structure comprising:
  - a substrate comprising a shallow PN junction formed at a first main surface, the shallow PN junction comprising a p-type region and an n-type region and being formed substantially parallel to the first main surface, and
  - a dielectric layer contacting the first main surface thereby forming a dielectric/semiconductor interface with one of the p-type region or the n-type region, wherein the shallow PN junction has a depth less than 100 nm from the dielectric/semiconductor interface;
- an apparatus configured for iterating, at least twice, a combination of processes including:
  - providing a respective charge on a predetermined area of the dielectric layer via a charge applicator, and
  - measuring a corresponding junction photovoltage for the predetermined area; and
- a non-transitory computer-readable medium comprising instructions such that when executed cause a processor to perform the following steps:
- deriving at least one of an average hole/electron mobility or a dose of active dopants for a predetermined area of the substrate comprising the shallow PN junction, from respective charges and corresponding junction photovoltages as used and/or derived in iterating the combination of processes.

* * * * *